(12) United States Patent
Sugawara

(10) Patent No.: US 11,114,586 B2
(45) Date of Patent: Sep. 7, 2021

(54) SEMICONDUCTOR LIGHT EMITTING DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Hideto Sugawara, Nonoichi (JP)

(73) Assignees: KABUSHIKI KAISHA TOSHIBA, Minato (JP); TOSHIBA ELECTRONIC DEVICES & STORAGE CORPORATION, Minato (JP)

(*) Notice: Subject to any disclaimer, the term of this patent is extended or adjusted under 35 U.S.C. 154(b) by 63 days.

(21) Appl. No.: 16/708,818

(22) Filed: Dec. 10, 2019

(65) Prior Publication Data
US 2021/0057605 A1    Feb. 25, 2021

(30) Foreign Application Priority Data
Aug. 22, 2019  (JP) .............................. JP2019-151768

(51) Int. Cl.
*H01L 33/06*  (2010.01)
*H01L 33/30*  (2010.01)

(52) U.S. Cl.
CPC .............. *H01L 33/06* (2013.01); *H01L 33/30* (2013.01)

(58) Field of Classification Search
CPC ................................ H01L 33/06; H01L 33/30
See application file for complete search history.

(56) References Cited

U.S. PATENT DOCUMENTS

| | | | |
|---|---|---|---|
| 5,521,935 A | 5/1996 | Irikawa | |
| 7,714,338 B2 * | 5/2010 | Takahashi | ................. H01S 5/22 257/94 |
| 7,875,961 B2 | 1/2011 | Linder et al. | |
| 8,168,986 B2 | 5/2012 | Nishinaka et al. | |

FOREIGN PATENT DOCUMENTS

| | | |
|---|---|---|
| JP | 7-202260 A | 8/1995 |
| JP | 2007-103930 A | 4/2007 |
| JP | 4655103 B2 | 3/2011 |

* cited by examiner

*Primary Examiner* — Savitri Mulpuri
(74) *Attorney, Agent, or Firm* — Oblon, McClelland, Maier & Neustadt, L.L.P.

(57) ABSTRACT

According to one embodiment, a semiconductor light emitting device includes a substrate, and a multi quantum well layer provided on the substrate, and including a plurality of barrier layers sandwiched between three or more InGaAs well layers and two InGaAs well layers. The barrier layers include at least two regions having different mixed crystal ratios or at least two regions having different thicknesses.

9 Claims, 6 Drawing Sheets

SEMICONDUCTOR LIGHT EMITTING DEVICE

CROSS-REFERENCE TO RELATED APPLICATIONS

This application is based upon and claims the benefit of priority from Japanese Patent Application No. 2019-151768, filed on Aug. 22, 2019; the entire contents of which are incorporated herein by reference.

FIELD

Embodiments described herein relate generally to a semiconductor light emitting device.

BACKGROUND

In a semiconductor light emitting device including a MQW (Multi Quantum Well) structure including an InGaAs well layer and a GaAs barrier layer, crystal strain is compensated by lattice mismatches of two layers to a GaAs substrate.

The luminous efficiency is improved by increasing of the number of MQW stacked layers in a power light emitting diode that requires high current injection.

However, if the number of MQW stacked layers is increased, new strain relaxation is likely to occur, and light emission characteristics are degraded and reliability is reduced.

DETAILED DESCRIPTION

According to one embodiment, a semiconductor light emitting device includes a substrate, and a multi quantum well layer provided on the substrate, and including three or more InGaAs well layers and a plurality of barrier layers sandwiched between two InGaAs well layers. The barrier layers include at least two regions having different mixed crystal ratios or at least two regions having different thicknesses.

Various embodiments are described below with reference to the accompanying drawings.

Figure 1A:
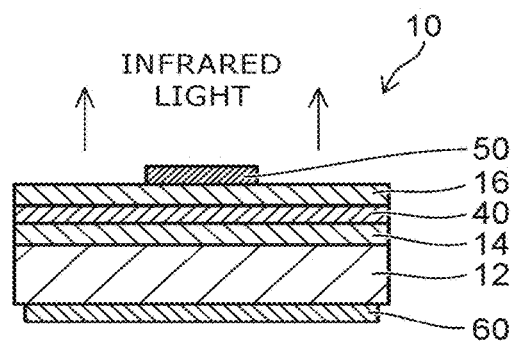
FIG. 1A is a schematic cross sectional view of a semiconductor light emitting device according to a first embodiment.
Figure 1B:
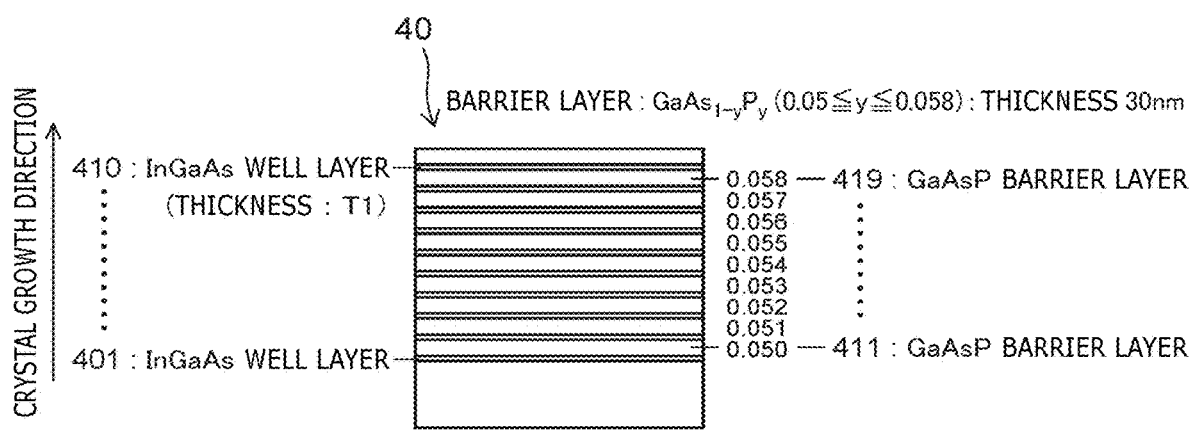
FIG. 1B is a schematic cross sectional view of a multi quantum well layer.

FIG. 1A is a schematic cross sectional view of a semiconductor light emitting device according to a first embodiment, and FIG. 1B is an enlarged schematic cross sectional view of a multi quantum well layer.

The semiconductor light emitting device 10 includes at least a substrate 12 and a multi quantum well layer 40.

As shown in FIG. 1A, the semiconductor light emitting device 10 can further include a first layer 14 including an AlGaAs cladding layer, a second layer 16 including an AlGaAs cladding layer, an upper electrode 50, and a lower electrode 60.

The multi quantum well layer 40 is provided on the substrate 12. As shown in FIG. 1B, the multi quantum well layer 40 includes three or more InGaAs well layers 401 to 410 and multiple $GaAs_{1-y}P_y$ barrier layers 411 to 419, and constitutes an active layer. Each of the multiple_GaAs1-yPy barrier layers is sandwiched between two InGaAs well layers of the three or more InGaAs well layers.

The InGaAs well layers 401 to 410 are all assumed to have the same In mixed crystal ratio x and thickness T1 (for example, 6 nm) of $In_xGa_{1-x}As$ (for example, 0<x≤0.2), for example. On the other hand, the barrier layers 411 to 419 include at least two regions having different Group V mixed crystal ratios of GaAsP. In FIG. 1B, in the barrier layers 411 to 419, the P mixed crystal ratio y continuously increases along the crystal growth direction (stacking direction), for example, from 0.05 to 0.058. That is, the P mixed crystal ratio y of the barrier layers 411 to 419 is not constant but changes. In this figure, all the P mixed crystal ratios are different in the barrier layers 411 to 419. Note that the thicknesses of the $GaAs_{1-y}P_y$ barrier layers 411 to 419 are all 30 nm, for example.

The semiconductor light emitting device 10 according to the first embodiment is, for example, an LED (Light Emitting Diode) capable of emitting infrared light having a wavelength of 1000 nm or less. Increasing the number of quantum well layers can increase the optical output. However, in this case, lattice relaxation is likely to occur in the InGaAs well layer. In the first embodiment, lattice relaxation is suppressed by changing the P mixed crystal ratio y of the GaAsP barrier layer. For this reason, a semiconductor light emitting device (LED: Light Emitting Diode, etc.) with a narrow half-width of the emission spectrum and improved reliability in long-time operation is provided.

Figure 2A:
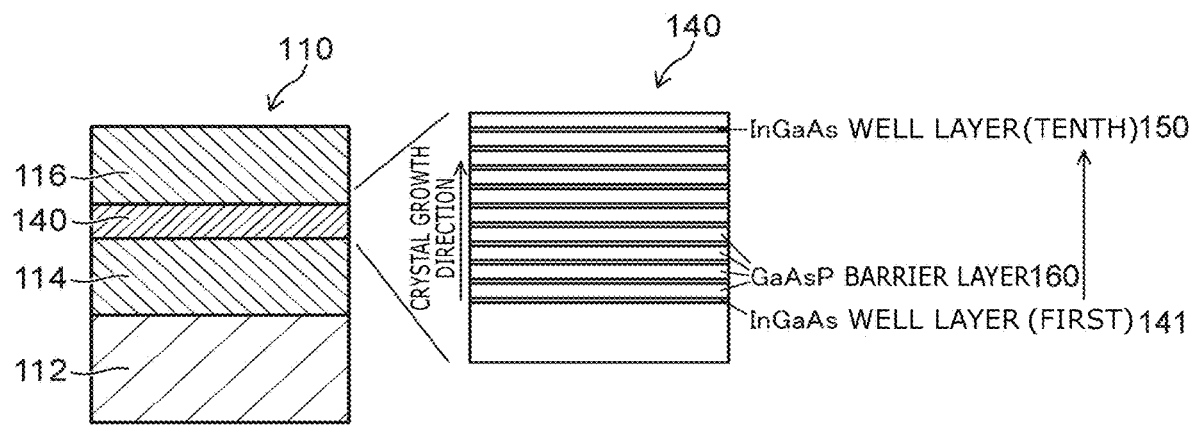
FIG. 2A is a schematic cross sectional view of a multi quantum well layer of a semiconductor light emitting device according to a comparative example.
Figure 2B:
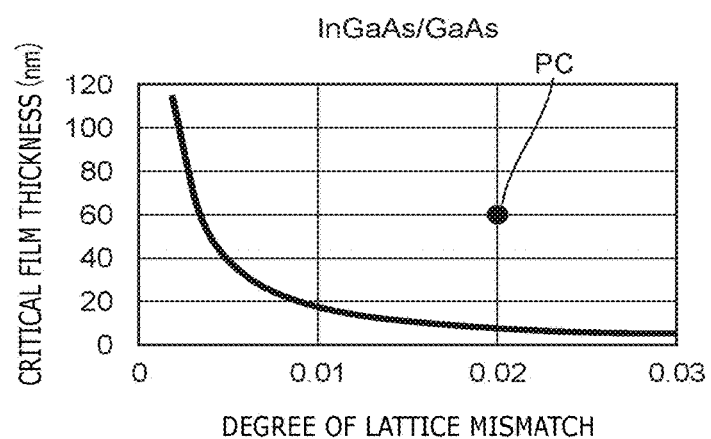
FIG. 2B is a graph view of a critical film thickness of InGaAs on the GaAs substrate.

FIG. 2A is a schematic cross sectional view of a multi quantum well layer of a semiconductor light emitting device according to a comparative example, and FIG. 2B is a graph view of a critical film thickness of InGaAs on the GaAs substrate.

As shown in FIG. 2A, the semiconductor light emitting device 110 includes a first layer 114 including an AlGaAs cladding layer, a multi quantum well layer 140, and a second layer 116 including an AlGaAs cladding layer. The $In_xGa_{1-x}As$ well layer 141 has x=0.15 and a thickness of 6 nm. The $GaAs_{1-y}P_y$ barrier layer 160 has y=0.05 and a thickness of 30 nm. In the comparative example, although the lattice constant of the InGaAs well layer 141 is large with respect to the GaAs substrate 112, the stress is balanced so that the lattice constant of the GaAsP barrier layer 160 is small with respect to the GaAs substrate 112. The emission wavelength is about 950 nm.

In FIG. 2B, the vertical axis represents the critical film thickness (nm), and the horizontal axis represents the degree of lattice mismatch. The critical film thickness is calculated using the Matthews equation and assuming that dislocations are edge dislocations. The degree of lattice mismatch is a value calculated using an elastic stiffness constant, assuming that the $In_{0.15}Ga_{0.85}As$ well layer is coherently stacked on the GaAs substrate and that the lattice of the $In_{0.15}Ga_{0.85}As$ well layer is elastically deformed to match a lattice of the GaAs substrate. The total film thickness (6 nm×10 layers=60 nm) of the InGaAs well layers 141 to 150 of the comparative example is represented by a point PC in the figure. The total film thickness of 60 nm in the comparative example exceeds the critical film thickness. That is, it can be said that the multi quantum well layer 140 according to the comparative example has a structure that is formed by the existence of the GaAsP barrier layer 160 having reverse strain.

Figure 3:
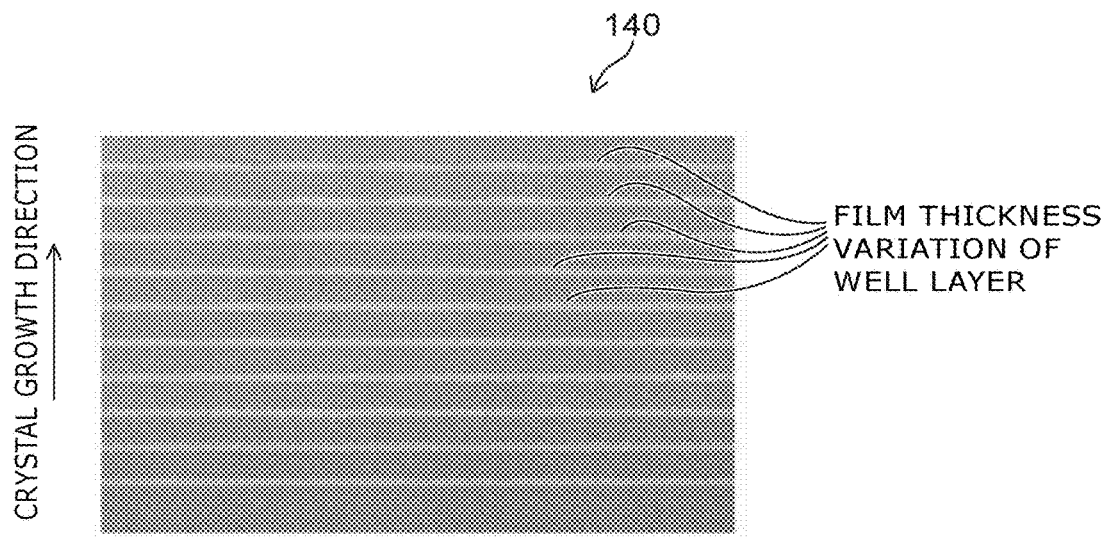
FIG. 3 is a TEM photograph of a cross section of the multi quantum well layer of the comparative example.

FIG. 3 is a TEM photograph of a cross section of the multi quantum well layer of the comparative example.

A white stripe portion shown in a cross-sectional TEM (Transmission Electron Microscope) observation photograph represents InGaAs well layers 141 to 150, and both sides thereof represent GaAsP barrier layers 160. The crystal growth direction is from the bottom to the top, and the interface between the well layer and the upper side barrier layer is kept almost flat from the bottom to the fifth layer. On the other hand, as it is higher than the sixth layer, the flatness of the interface between the well layer and the upper side barrier layer is impaired, and the thickness of the well layer fluctuates. This interface non-uniformity increases as the crystal growth progresses (as it goes upward in the photograph). This non-uniformity is due to lattice relaxation (thickness variation, etc.) of the InGaAs well layers 141 to 150, and is thought to be because strain compensation in the GaAsP barrier layer does not function as crystal growth proceeds.

In the element design, the stress due to the difference in lattice constant is configured to be balanced, however, the cause of the lattice relaxation may be influenced by, for example, occurrence of the stress relief on the upper surface of the stack as crystal growth proceeds, the stress relief might be caused by the warp or shape of the substrate. For these reasons, in the comparative example, the emission spectrum is widened to about 40 nm or the like, or the optical output after 10,000 hours of operation is likely to decrease by 5% or more accompanied with reliability decrease.

On the other hand, according to the first embodiment, since the lattice relaxation of the InGaAs well layers 401 to 410 is suppressed, the flatness of the interface between the well layer and the upper side barrier layer is maintained, and the thickness can be adjusted evenly along the crystal growth direction. As a result, it is easy to obtain a narrow emission spectrum width of 30 nm or less, and the decrease in the optical output after 10,000 hours of operation can be reduced to, for example, 1% or less.

Figure 4:
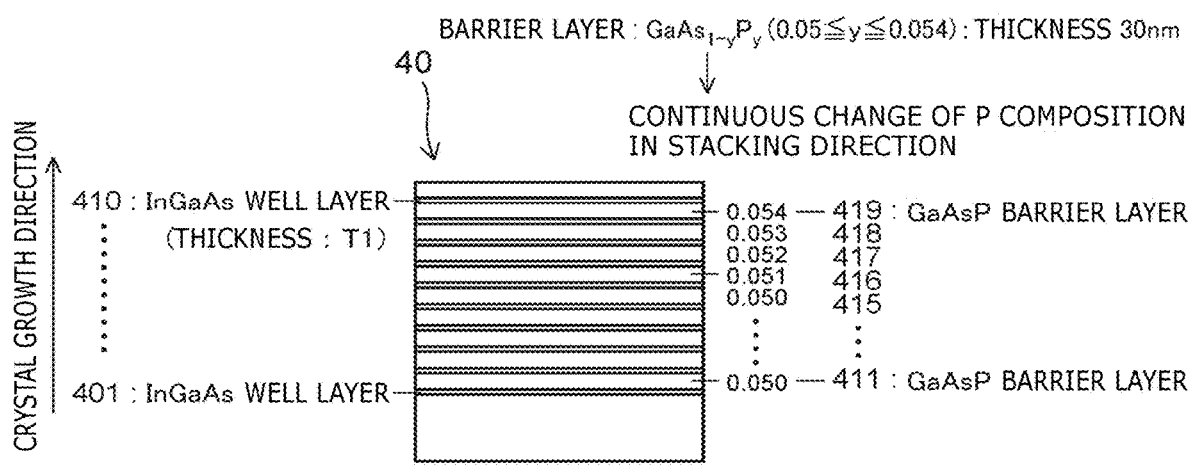
FIG. 4 is a schematic cross sectional view of a multi quantum well layer of a semiconductor light emitting device according to a second embodiment.

FIG. 4 is a schematic cross sectional view of a multi quantum well layer of a semiconductor light emitting device according to a second embodiment.

The InGaAs well layers 401 to 410 are all assumed to have the same In mixed crystal ratio x and thickness T1 of $In_xGa_{1-x}As$, for example. On the other hand, the barrier layers 411 to 419 include at least two regions having different P mixed crystal ratios y of $GaAs_{1-y}P_y$. In FIG. 4, in the GaAsP barrier layer, the first regions 416 to 419 having a high P mixed crystal ratio y are crystal-grown on the second regions 411 to 415 having a low P mixed crystal ratio y. In the first regions 416 to 419 of the GaAsP barrier layer, the P mixed crystal ratio y increases from, for example, 0.051 to 0.054 along the crystal growth direction (stacking direction). That is, the P mixed crystal ratio y of the GaAsP barrier layers 411 to 419 is not constant but changes.

The thicknesses of the GaAsP barrier layers 411 to 419 are all assumed to be 30 nm, for example. In this way, it is easy to obtain a narrow emission spectrum width of 30 nm or less, and a decrease in the optical output after 10,000 hours of operation can be reduced to, for example, 1% or less.

Figure 5:
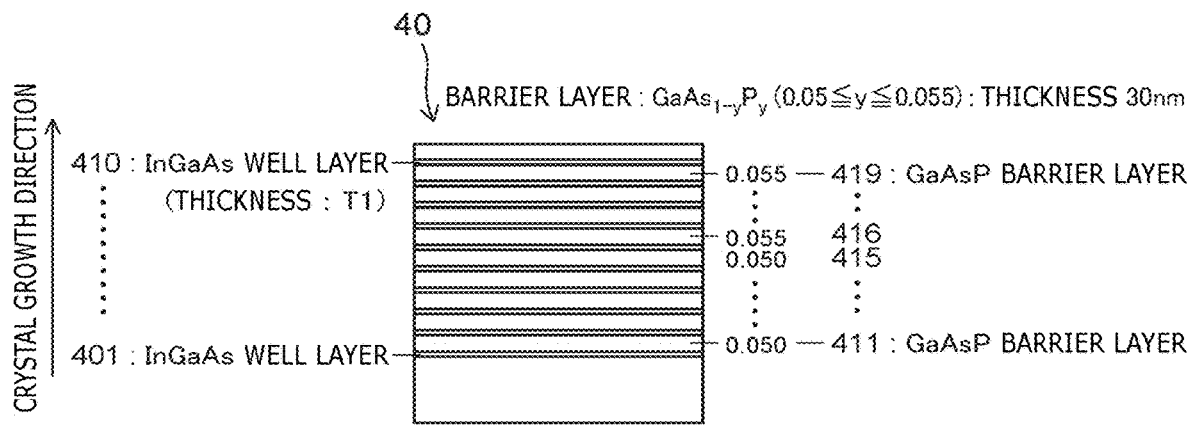
FIG. 5 is a schematic cross sectional view of a multi quantum well layer of a semiconductor light emitting device according to a third embodiment.

FIG. 5 is a schematic cross sectional view of a multi quantum well layer of a semiconductor light emitting device according to a third embodiment.

The InGaAs well layers 401 to 410 are all assumed to have the same In mixed crystal ratio x and thickness T1 of $In_xGa_{1-x}As$, for example. On the other hand, the GaAsP barrier layers 411 to 419 include at least two regions having different P mixed crystal ratios y of $GaAs_{1-y}P_y$. In FIG. 5, in the GaAsP barrier layer, the first regions 416 to 419 having a high P mixed crystal ratio y are crystal-grown (stacked) on the second regions 411 to 415 having a low P mixed crystal ratio y. That is, in the GaAsP barrier layers 416 to 419, the P mixed crystal ratio y is constant, for example, 0.055. In the second regions 411 to 415, the P mixed crystal ratio y is lower and constant, for example, 0.05.

The thicknesses of the GaAsP barrier layers 411 to 419 are all assumed to be 30 nm, for example. In this way, it is easy to obtain a narrow emission spectrum width of 30 nm or less, and a decrease in the optical output after 10,000 hours of operation can be reduced to, for example, 1% or less.

Figure 6:
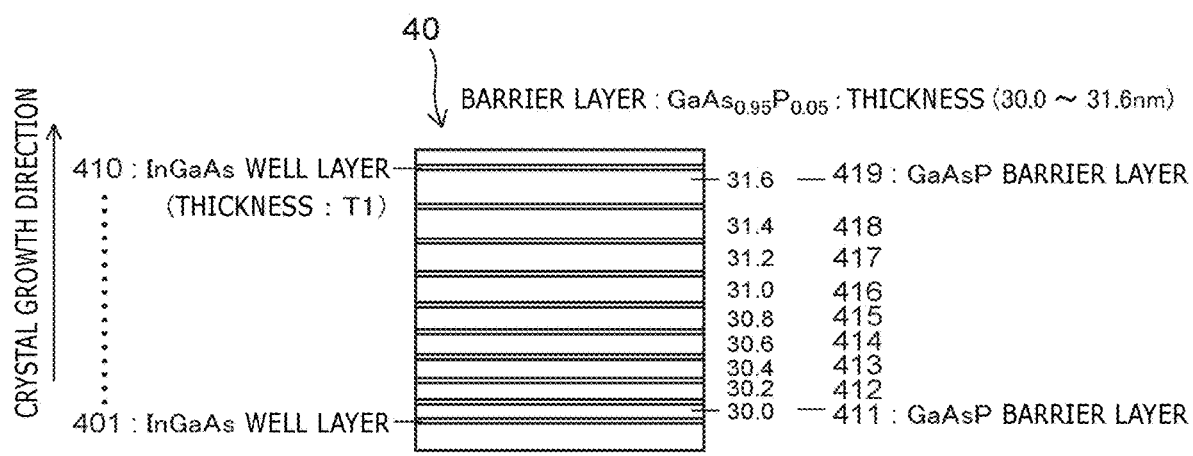
FIG. 6 is a schematic cross sectional view of a multi quantum well layer of a semiconductor light emitting device according to a fourth embodiment.

FIG. 6 is a schematic cross sectional view of a multi quantum well layer of a semiconductor light emitting device according to a fourth embodiment.

The InGaAs well layers 401 to 410 are all assumed to have the same In mixed crystal ratio x and thickness T1 of $In_xGa_{1-x}As$, for example. On the other hand, the GaAsP barrier layers 411 to 419 include at least two regions having different thicknesses. The thickness of the GaAsP barrier layers 411 to 419 continuously increases, for example, from 30.0 nm to 31.6 nm, for example, by 0.2 nm along the crystal growth direction (stacking direction). In this way, it is easy to obtain a narrow emission spectrum width of 30 nm or less, and the decrease in the optical output after 10,000 hours of operation can be reduced to, for example, 1% or less.

Figure 7:
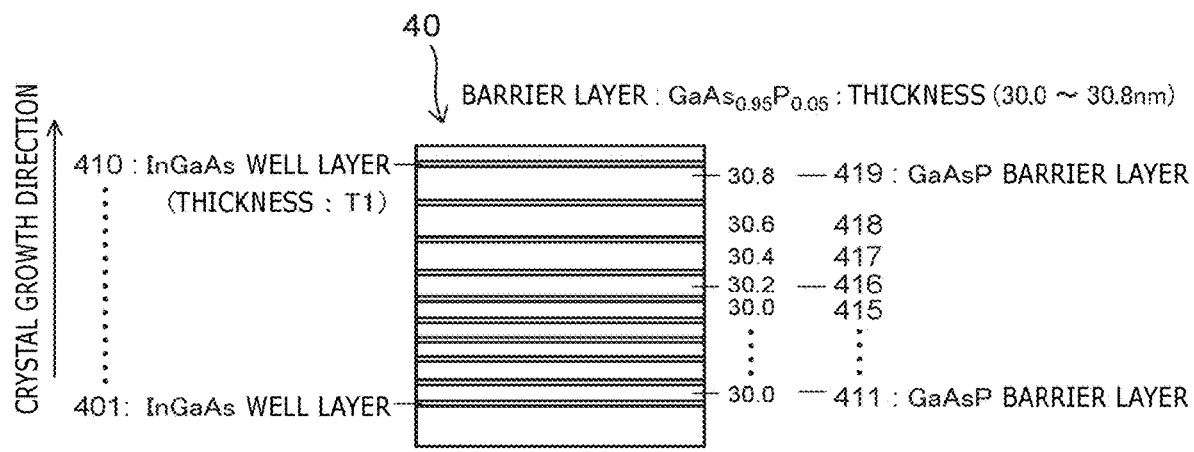
FIG. 7 is a schematic cross sectional view of a multi quantum well layer of a semiconductor light emitting device according to a fifth embodiment.

FIG. 7 is a schematic cross sectional view of a multi quantum well layer of a semiconductor light emitting device according to a fifth embodiment.

The InGaAs well layers 401 to 410 are all assumed to have the same In mixed crystal ratio x and thickness T1 of $In_xGa_{1-x}As$, for example. On the other hand, the thickness of the GaAsP barrier layers 411 to 419 varies along the crystal growth direction (stacking direction). In FIG. 7, third regions 416 to 419 having a large thickness are provided by crystal growth (stacking) on fourth regions 411 to 415 having a small thickness. For example, the thickness of the fourth region 411 to 415 of the GaAsP barrier layer is constant, for example, 30 nm, but the thickness of the third region 416 to 419 of the GaAsP barrier layer continuously increases by 0.2 nm from 30.2 to 30.8 nm, for example, along the crystal growth direction (stacking direction).

In this way, it is easy to obtain a narrow emission spectrum width of 30 nm or less, and a decrease in the optical output after 10,000 hours of operation can be reduced to, for example, 1% or less.

Figure 8:
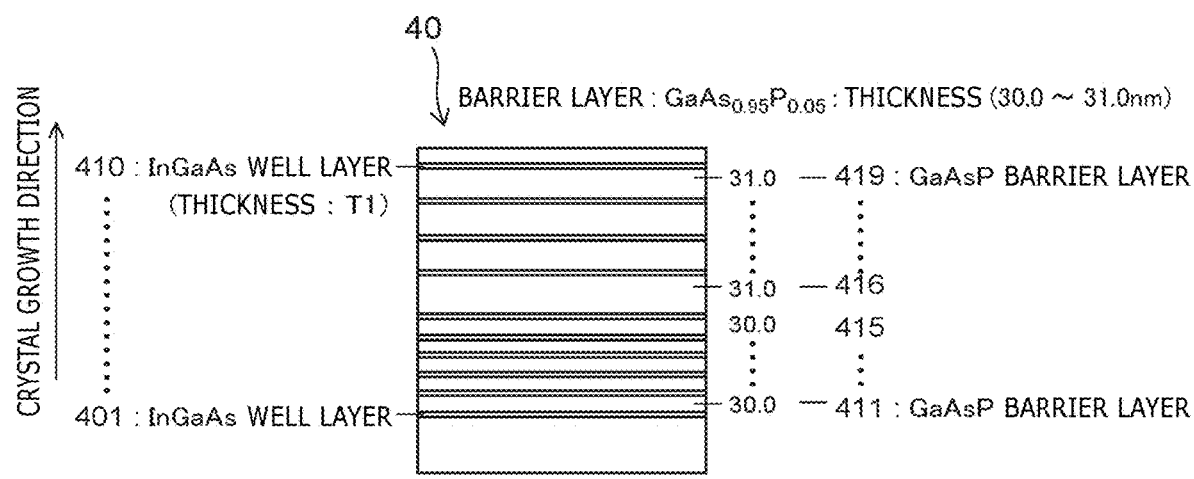
FIG. 8 is a schematic cross sectional view of a multi quantum well layer of a semiconductor light emitting device according to a sixth embodiment.

FIG. 8 is a schematic cross sectional view of a multi quantum well layer of a semiconductor light emitting device according to a sixth embodiment.

The InGaAs well layers 401 to 410 are all assumed to have the same In mixed crystal ratio x and thickness T1 of $In_xGa_{1-x}As$, for example. On the other hand, the thickness of the GaAsP barrier layers 411 to 419 varies along the crystal growth direction (stacking direction). In FIG. 8, the third regions 416 to 419 are provided on the regions of the fourth regions 411 to 415 having a small thickness. For example, the thickness of the GaAsP barrier layers 411 to 415 is constant, for example, 30 nm, and the thickness of the GaAsP barrier layers 416 to 419 is constant, for example, 31 nm and is larger than the thickness of the barrier layers 411 to 415.

In this way, it is easy to obtain a narrow emission spectrum width of 30 nm or less, and a decrease in optical output after 10,000 hours of operation can be reduced to, for example, 1% or less.

Figure 9:
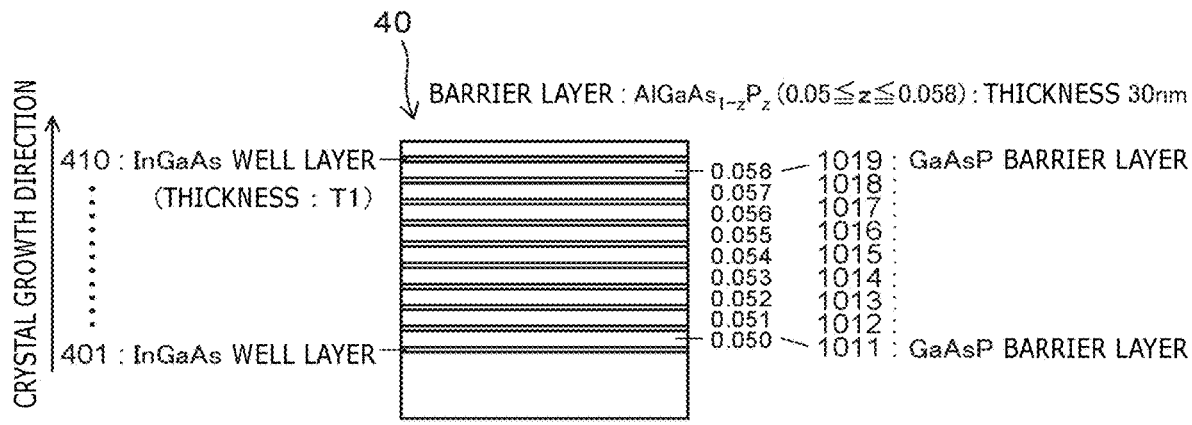
FIG. 9 is a schematic cross sectional view of a multi quantum well layer of a semiconductor light emitting device according to a seventh embodiment.

FIG. 9 is a schematic cross sectional view of a multi quantum well layer of a semiconductor light emitting device according to a seventh embodiment.

The InGaAs well layers 401 to 410 are all assumed to have the same In mixed crystal ratio x and thickness T1 of $In_xGa_{1-x}As$, for example. On the other hand, the barrier layers 1011 to 1019 are made of $Al_zGa_{1-z}As_{1-y}P_y$ ($0.0 \leq y \leq 0.058$), and their thicknesses are all assumed to be 30 nm, for example. By adding Al to the barrier layer, the band gap is increased, and the effect of confining carriers in the well layer can be enhanced. However, as the barrier height increases, the bias voltage required for carrier injection also increases.

On the other hand, the influence on the lattice mismatch is small, and the device characteristics are substantially determined by the P mixed crystal ratio y, and the characteristics necessary for strain compensation are the same as those in the first embodiment.

The $Al_zGa_{1-z}As_{1-y}P_y$ barrier layers 1011 to 1019 include at least two regions having different P mixed crystal ratios y. In FIG. 9, the $Al_zGa_{1-z}As_{1-y}P_y$ barrier layers 1011 to 1019 change such that the P mixed crystal ratio y increases along the crystal growth direction (stacking direction), for example, 0.05 to 0.058. Even in this case, it is easy to obtain a narrow emission spectrum width of 30 nm or less, and a decrease in optical output after 10,000 hours of operation can be reduced to 1% or less, for example.

Figure 10:
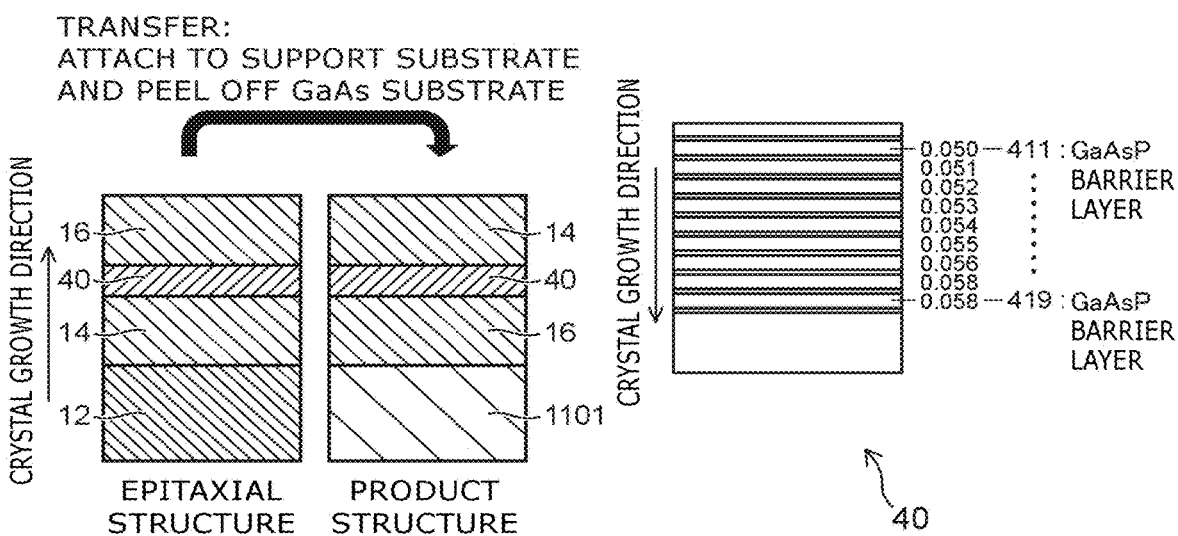
FIG. 10 is a schematic cross sectional view of a multi quantum well layer of a semiconductor light emitting device according to an eighth embodiment.

FIG. 10 is a schematic cross sectional view of a multi quantum well layer of a semiconductor light emitting device according to an eighth embodiment.

In the first embodiment, a first layer 14 including an AlGaAs cladding layer, a multi quantum well layer 40, and a second layer 16 including an AlGaAs cladding layer are grown on the GaAs substrate 12 in this order. In the eighth embodiment, after the surface of the second layer 16 is attached in a wafer state to the surface of a separately prepared support substrate 1101, the GaAs substrate 12 used for crystal growth is peeled off. As the support substrate 1101, for example, any one of Si, Ge, $Al_2O_3$, an oxide film other than $Al_2O_3$, and a metal can be used.

According to the eighth embodiment, the top and bottom of the multi quantum well layer are inverted by the transfer. That is, the multi quantum well layers are arranged so that the crystal growth direction is directed to the support substrate 1101. According to the multi quantum well layer of the embodiment, since the lattice relaxation of the InGaAs well layer is suppressed, the same effects as those of the first embodiment can be obtained even if transferred.

According to the semiconductor light emitting devices of the first to eighth embodiments, a semiconductor light emitting device having a narrow half-value width of the emission spectrum and improved reliability in long-time operation is provided. These semiconductor light emitting devices can emit infrared light having a wavelength of 1000 nm or less, for example.

These semiconductor light emitting devices can be widely used for imaging such as LiDAR (Light Detection and Ranging) used in automobile driving systems, remote controllers, photocouplers, infrared light sources such as IrDA (Infrared Data Association), and the like.

The embodiments of the invention are not limited to these. The number of multi quantum wells is not limited to 10. The embodiments may also include cases where lattice relaxation may occur in the InGaAs well layer and a plurality of barrier layers are provided. Although a GaAs substrate was used as the crystal growth substrate, when a crystal growth foundation layer made of semiconductors is stacked between the substrate such as InP, GaP, Si, Ge, an oxide film and $Al_2O_3$, and the multi quantum well layer, the stacked layer serves as a reference of the lattice relaxation of InGaAs, therefore the critical film thickness of InGaAs is not determined simply by the lattice constant of the substrate. In this case, the crystal growth foundation layer may include one of compound semiconductor, Si, Ge, and the oxide film. The compound semiconductor includes one of In, Ga, Al, P, or As.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   a substrate; and
   a multi quantum well layer provided on the substrate,
   the multi quantum well layer including a plurality of InGaAs well layers and a plurality of barrier layers, the plurality of barrier layers each being made of AlGaAsP mixed crystal represented by a formula $Al_zGa_{1-z}As_{1-y}P_y$ ($0 \leq z < 1$, $0 < y < 1$), the InGaAs well layers and the barrier layers being stacked alternately in a first direction from a substrate toward the multi quantum well layer, the plurality of barrier layers including first barrier layers and second barrier layers, a group of the second barrier layers being provided next to a group of the first barrier layers,
   wherein the first barrier layers each include a first AlGaAsP mixed crystal represented by a formula $Al_zGa_{1-z}As_{1-y}P_y$ ($0 \leq z < 1$, $0 < y < 1$) and the second barrier layers each include a second AlGaAsP mixed crystal represented by a formula $Al_zGa_{1-z}As_{1-y2}P_{y2}$ ($0 \leq z < 1$, $0 < y1 < 1 < y2 < 1$); or
   wherein the first barrier layers have first thicknesses in the first direction, respectively, and the second barrier layers have second thicknesses in the first direction, respectively, the second thicknesses being larger than the first thicknesses.

2. The device according to claim 1, wherein
the first barrier layers are provided with the composition ratios y1 different from each other,
the second barrier layers are provided with the composition ratios y2 different from each other; and
the plurality of barrier layers are arranged such that the composition ratios y1, y2 increase or decrease continuously in the first direction.

3. The device according to claim 1, wherein
the second barrier layers are provided next to the first barrier layers in the first direction.

4. The device according to claim 3, wherein
the first barrier layers are arranged with the same composition ratio y1; and
the second barrier layers are provided with the composition ratios y2 different from each other, and are arranged such that the composition ratios y2 increase continuously in the first direction.

5. The device according to claim 3, wherein
the first barrier layers are arranged with the same composition ratio y1; and
the second barrier layers are arranged with the same composition ratio y2.

6. The device according to claim 1, wherein
the substrate includes one of GaAs, InP, Si, Ge, or $Al_2O_3$.

7. The device according to claim 1, further comprising:
a foundation layer provided between the substrate and the multi quantum well layer,
the substrate including one of InP, GaP, Si, Ge or an oxide film, and
the foundation layer including one of compound semiconductor, Si, Ge, and the oxide film, the compound semiconductor including one of In, Ga, Al, P, or As.

8. The device according to claim 1, wherein
the first and second thicknesses of the barrier layers are provided so that the plurality of barrier layers are arranged with the thicknesses increasing or decreasing continuously in the first direction.

9. The device according to claim 1, wherein
the first barrier layers each have the same first thickness, and
the second barrier layers each have the same second thickness.

* * * * *